United States Patent
Taguchi et al.

[11] Patent Number: 6,018,281
[45] Date of Patent: *Jan. 25, 2000

[54] RESONATOR TYPE SURFACE ACOUSTIC WAVE LADDER FILTER WITH VOLTAGE VARIABLE CAPACITANCE ELEMENT

[75] Inventors: Yutaka Taguchi, Osaka; Kazuo Eda, Nara; Keiji Onishi; Shunichi Seki, both of Osaka, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/616,190

[22] Filed: Mar. 15, 1996

[30] Foreign Application Priority Data

Mar. 15, 1995 [JP] Japan ................... 7-056127

[51] Int. Cl.[7] .................................. H03H 9/64
[52] U.S. Cl. ................. 333/193; 333/195; 310/313 R
[58] Field of Search ................... 333/193–196, 333/188; 310/313 R–313 D

[56] References Cited

U.S. PATENT DOCUMENTS

| | | | |
|---|---|---|---|
| 4,011,526 | 3/1977 | Kinsman | 333/193 |
| 4,166,258 | 8/1979 | Tseng | 333/195 |
| 4,989,264 | 1/1991 | Ohto | 333/193 |
| 5,010,269 | 4/1991 | Hikita et al. | 333/195 |
| 5,107,233 | 4/1992 | Stoft | 333/174 |
| 5,166,646 | 11/1992 | Avanic et al. | 333/193 X |
| 5,291,159 | 3/1994 | Vale | 333/188 |
| 5,506,552 | 4/1996 | Seki et al. | 333/195 |

FOREIGN PATENT DOCUMENTS

| | | |
|---|---|---|
| 44 09 989 A1 | 12/1994 | Germany . |
| 3-201815 | 9/1991 | Japan ................... 333/195 |
| 3-278609 | 12/1991 | Japan . |
| 4-207621 | 7/1992 | Japan . |
| 6-260876 | 9/1994 | Japan ................... 333/193 |

OTHER PUBLICATIONS

Abstract, 1640 E 77, Surface Acoustic Wave Filter, Kokai No. 52–19044, Feb. 14, 1977, Appl. No. 50–95184, Aug. 4, 1975, Nippon Denshin Denwa Kosha, Hiromichi Jumonji, JPC: 98(3)A32, Int. Cl$^2$. H03H9/00.

Abstract, Band Pass Filter of Surface Acoustic Wave, 58–154917(A), Sep. 14, 1983, JP, Appl. No. 57–36410, Mar. 10, 1982, Hitachi Seisakusho, K.K., Mitsutaka Hikita, Int. Cl$^3$. H03H9/64, H03H9/145.

Abstract, Polarized Type Saw Resonator Filter, 3–222512 (A), Oct. 1, 1991, JP, Appl. No. 2–16003, Jan. 29, 1990, Oki Electric Ind. Co. Ltd., Tomokazu Kmazaki (2), Int. Cl$^5$. H03H9/64, H03H9/25.

*Primary Examiner*—Robert Pascal
*Assistant Examiner*—Barbara Summons
*Attorney, Agent, or Firm*—Smith, Gambrell & Russell; Beveridge, DeGrandi, Weilacher & Young Intellectual Property Group

[57] ABSTRACT

To realizing a filter which is capable of properly controlling the passband, and the attenuation pole of a surface acoustic wave filter, a surface acoustic wave filter connected in a ladder type with the surface acoustic wave resonators 104, 105 has an element 106 which changes in capacity by voltage to be impressed and is connected in series with a resonator 105 connected in parallel to the signal line 100.

42 Claims, 9 Drawing Sheets

RESONATOR TYPE SURFACE ACOUSTIC WAVE LADDER FILTER WITH VOLTAGE VARIABLE CAPACITANCE ELEMENT

BACKGROUND OF THE INVENTION

1. Field of the Invention

The present invention relates to a surface acoustic wave filter, especially to a surface acoustic wave filter to be used in a high frequency region.

2. Related art of the Invention

In recent years, the researches of the surface acoustic wave elements have been briskly effected so as to use for filters. The surface acoustic wave elements, especially, the surface acoustic wave filters are positively developed especially by the development and higher frequency of the recent portable communication unit.

Several types of methods of composing a filter with surface acoustic wave elements have been known in high frequency bands, especially in several hundred Mhz. As representative types, there are such a ladder type of making filters with the use of a plurality of surface acoustic wave resonators as shown in Japanese Laid-Open Patent Application Tokkaisho No. 52-19044, such IIDT type as shown in Japanese Laid-Open Patent Application Tokkaisho No. 58-154917, such inline resonator coupled filter as shown in Japanese Laid-Open Patent Application Tokkaihei No. 3-222512, which are set in adjacent relation to use the coupling among the resonators.

In recent years, a smaller type of surface acoustic wave filters superior in function are demanded for a smaller potable communication unit apparatus. In the major using locations, they are often used as interstate filters for transmission or reception, or output filters for local oscillators. Recently the ladder type among them is noteworthy in characteristics. The ladder type filter is constituted as FIG. 17, multi-stages of which are usually used. Reference numeral 2001 is an input terminal. Reference terminal 2002 is an output terminal. Reference numeral 2003 is a surface acoustic wave resonator which is in series with the signal line 100. Reference numeral 2004 is a surface acoustic wave resonator which is located between the signal line 100 and the earth. The filter characteristics are constructed by controlling the resonance frequency and anti-resonance frequency of the series resonator and the parallel resonator as shown in FIG. 18. The "A" point which is a lower attenuation pole out the passband of the filter which is the resonance frequency of the parallel resonator, while the "B" point which is a higher attenuation pole out of the passband corresponds to the anti-resonance frequency of the series resonator. Also, the passband is determined by the anti-resonance frequency of the parallel resonator and the resonance frequency of the series resonator.

As performance to be desired for the recent filters, lower loss is required within the passband and higher attenuation is required in the stopband.

But two demands are contrary to each other. When the low loss is pursued, the attenuation becomes smaller. When the attenuation is made larger, the loss is likely to increase. In the characteristics of the filter, the loss within the band and the attenuation out of the band are often regulated across some frequency ranges. But in the case of the surface acoustic wave filter, the attenuation out of the band is deteriorated when it was away from the passband as in the C point of FIG. 18. It was often difficult to make a low loss filter especially when the higher attenuation was required in a plurality of frequency bands. Intervals of the resonance frequency, anti-resonance frequency of the surface acoustic wave resonator are almost determined by the piezo-electric substrate to be formed by the surface acoustic wave resonator. Therefore, the band width as the filter is not free in degree as much as that. When a LiTaO$_3$ substrate of 36° Y cut X propagation generally used is used, 33 MHz was almost a limit in a filter with a 900 MHz band as a central frequency. When the band or more is required, the filter cannot be constructed as a defect.

SUMMARY OF THE INVENTION

It is an object of the invention to provide a surface acoustic wave filter which is properly capable of controlling the passband and the attenuation pole, upon consideration of the problem with a conventional surface acoustic wave filter as discussed above.

The invention is based on varying the frequency, upon consideration that the surface acoustic wave filter has a higher attenuation in the A, B points of FIG. 18. A surface acoustic wave filter with surface acoustic wave resonators being connected in a ladder type, of the present invention is such that an element to change in capacity by voltage to be impressed is connected in series with respect to at least one of resonators connected in parallel to a signal line.

A surface acoustic wave filter with surface acoustic wave resonators being connected in a ladder type, of the present invention is such that an element to change in capacity by voltage to be impressed is connected in parallel to at least one of the resonators connected in parallel with a signal line.

A surface acoustic wave filter with surface acoustic wave resonators being connected in a ladder type, of the present invention is such that an element to change in capacity by voltage to be impressed is connected in series with respect to at least one of resonators connected in series with a signal line.

A surface acoustic wave filter with surface acoustic wave resonators being connected in a ladder type, of the present invention is such that an element to change in capacity by voltage to be impressed is connected in parallel to at least one of resonators connected in series with a signal line.

A surface acoustic wave filter with surface acoustic wave resonators being connected in a ladder type, of the present invention is such that an element to change in capacity by voltage to be impressed is connected in series with respect to at least one of the resonators connected in parallel with a signal line, and an element to change in capacity by voltage to be impressed is connected in parallel to at least one of resonators connected in parallel with the signal line.

A surface acoustic wave filter with surface acoustic wave resonators being connected in a ladder type, of the present invention is such that an element to change in capacity by voltage to be impressed is connected in series with respect to at least one of resonators connected in parallel with a signal line, and an element to change in capacity by voltage to be impressed is connected in series to at least one of resonators connected in series with the signal line.

A surface acoustic wave filter with surface acoustic wave resonators being connected in a ladder type, of the present invention is such that an element to change in capacity by voltage to be impressed is connected in series with respect to at least one of resonators connected in parallel with a signal line, and an element to change in capacity by voltage to be impressed is connected in parallel to at least one of resonators connected in series with the signal line.

A surface acoustic wave filter with surface acoustic wave resonators being connected in a ladder type, of the present invention is such that an element to change in capacity by voltage to be impressed is connected in parallel with respect to at least one of resonators connected in parallel with a signal line, and an element to change in capacity by voltage to be impressed is connected in series to at least one of resonators connected in series with the signal line.

A surface acoustic wave filter with surface acoustic wave resonators being connected in a ladder type, of the present invention is such that an element to change in capacity by voltage to be impressed is connected in parallel with respect to at least one of resonators connected in parallel with a signal line, and an element to change in capacity by voltage to be impressed is connected in parallel to at least one of resonators connected in series with the signal line.

A surface acoustic wave filter with surface acoustic wave resonators being connected in a ladder type, of the present invention is such that an element to change in capacity by voltage to be impressed is connected in series with respect to at least one of resonators connected in series with a signal line, and an element to change in capacity by voltage to be impressed is connected in parallel to at least one of resonators connected in series with the signal line.

A surface acoustic wave filter with surface acoustic wave resonators being connected in a symmetrical lattice type, of the present invention is such that an element to change in capacity by voltage to be impressed is connected in parallel to at least one of the surface acoustic wave resonators.

A surface acoustic wave filter with surface acoustic wave resonators being connected in a symmetrical lattice type, of the present invention is such that an element to change in capacity by voltage to be impressed is connected in series with at least one of the surface acoustic wave resonators.

Such constitution of the present invention results in such effect that the resonance frequency, anti-resonance frequency of the resonator can be changed by the voltage impression from the outside, and the pole of the attenuation of the passband or out of the band can be moved.

Figure 1:
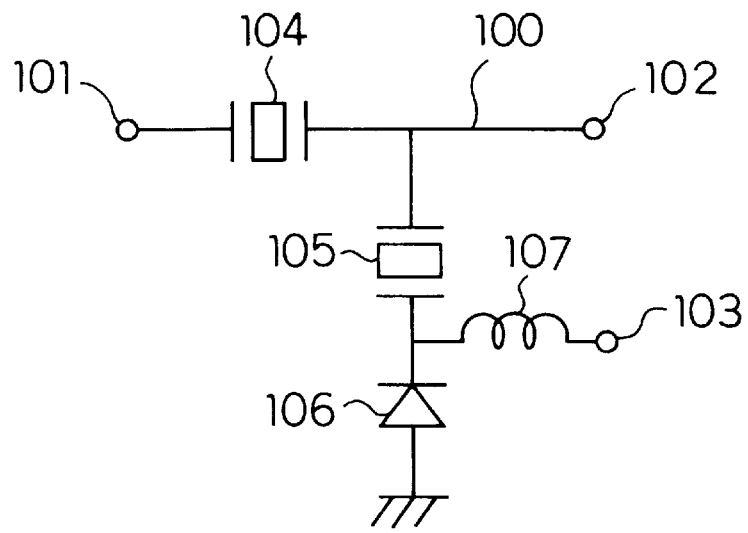
FIG. 1 is a circuit diagram for embodiment 1 of the invention.

Reference numerals for the drawings as follows:
101 . . . input terminal
102 . . . output terminal
103 . . . voltage impressing terminal
104 . . . surface acoustic wave resonator
105 . . . surface acoustic wave resonator
106 . . . varactor diode
107 . . . coil

PREFERRED EMBODIMENTS

Embodiments of the invention will be described hereinafter with reference to the drawings.

Embodiment 1

Figure 2:
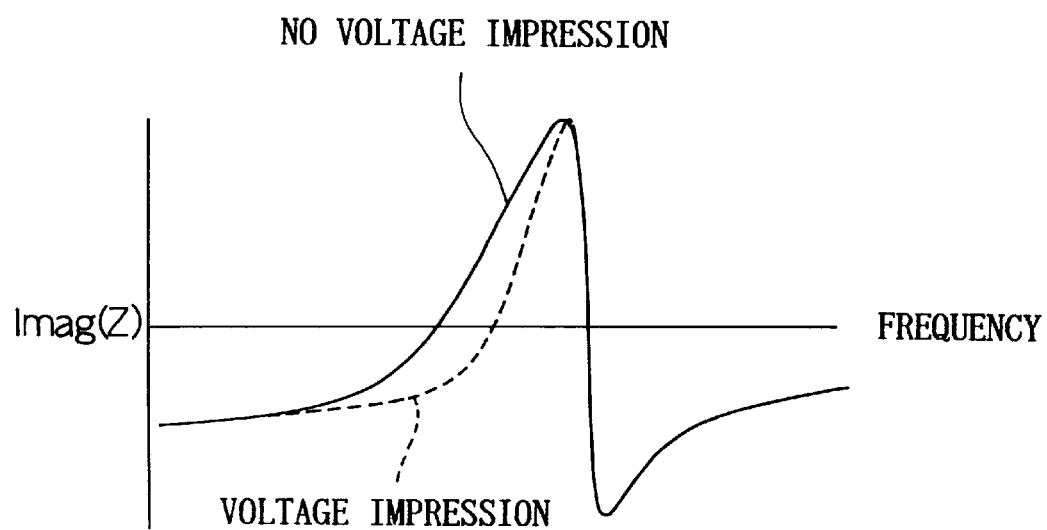
FIG. 2 is a graph showing the resonance characteristics for embodiment of the invention.

The ladder type embodiment 1 of the invention will be described. A filter was made with the use of LiTaO$_3$ substrate of 36° Y cut X propagation as a substrate for forming the surface acoustic wave resonator. An element which changes in capacity by voltage to be impressed, namely a varactor diode is connected in series with a resonator connected in parallel with the signal wire. The connection at this time is shown in FIG. 1. Reference numeral 101 is an input terminal. Reference terminal 102 is an output terminal. Reference numeral 103 is a terminal for impressing the voltage upon the voltage. Reference numeral 104 is a surface acoustic wave resonator which is in series with the signal line 100. Reference numeral 105 is a surface acoustic wave resonator which is located between the signal line 100 and the earth. Reference numeral 106 is a varactor diode. Reference numeral 107 is a coil for isolating the voltage impressing terminal 103 in high frequency. The surface acoustic wave filter is constructed as described above and the voltage to be impressed upon the varactor diode 106 was changed. The series connecting circuit of the varactor diode 106 and the surface acoustic wave resonator 105 which is connected in parallel between the signal line 100, had a resonance curve as shown in FIG. 2. The resonance point moved in this manner, thus resulting in the movement of the attenuation pole of the filter.

Embodiment 2

Figure 3:
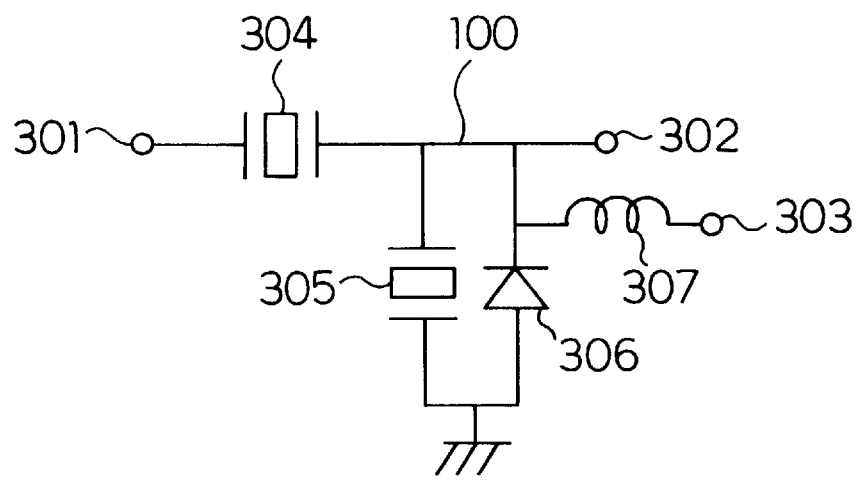
FIG. 3 is a circuit diagram in the embodiment 2 of the invention.
Figure 4:
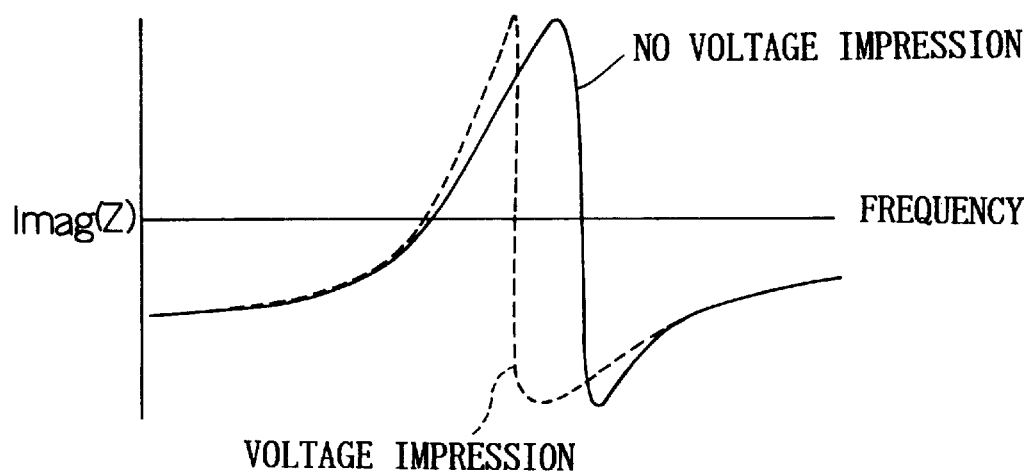
FIG. 4 is a graph showing the resonance characteristics for embodiment 2 of the invention.

The ladder type embodiment 2 of the invention will be described. A filter was made with the use of the LiTaO$_3$ substrate of 36° Y cut X propagation as a substrate for forming the surface acoustic wave resonator. An element which changes in the capacity by voltage to be impressed, namely a varactor diode is connected in parallel with a resonator connected in parallel to the signal wire. The connection at this time is shown in FIG. 3. Reference numeral 301 is an input terminal. Reference terminal 302 is an output terminal. Reference numeral 303 is a terminal for impressing the voltage upon the voltage. Reference numeral 304 is a surface acoustic wave resonator which is in series with the signal line 100. Reference numeral 305 is a surface acoustic wave resonator which is located between the signal line 100 and the earth. Reference numeral 306 is a varactor diode. Reference numeral 307 is a coil for isolating the voltage impressing terminal in high frequency. The surface acoustic wave filter was constructed as described above and the voltage to be impressed upon the varactor diode was changed. The parallel connecting circuit of the varactor diode and the elastic surface resonator connected in parallel to the signal line 100, had a resonance curve as shown in FIG. 4. The anti-resonance point moved in this manner, thus resulting in the movement of the passband of the filter.

Embodiment 3

Figure 5:
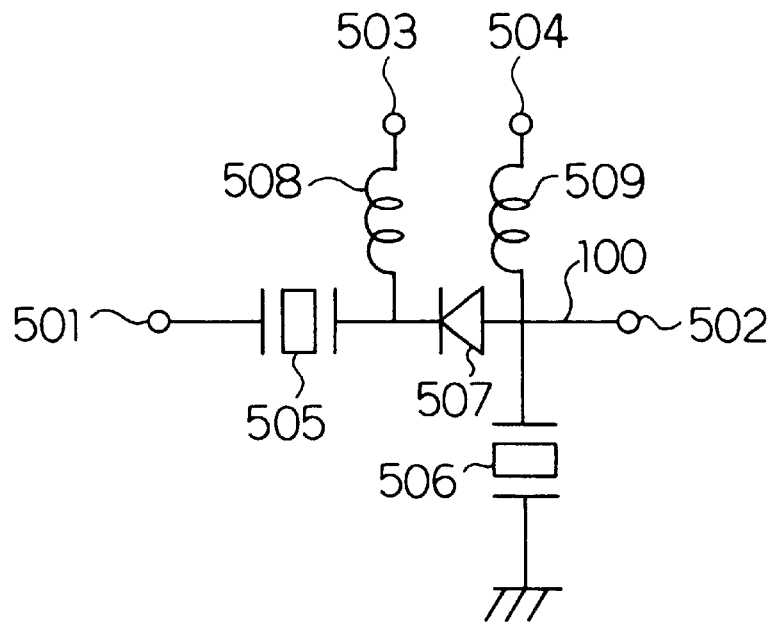
FIG. 5 is a circuit diagram in the embodiment 3 of the invention.
Figure 6:
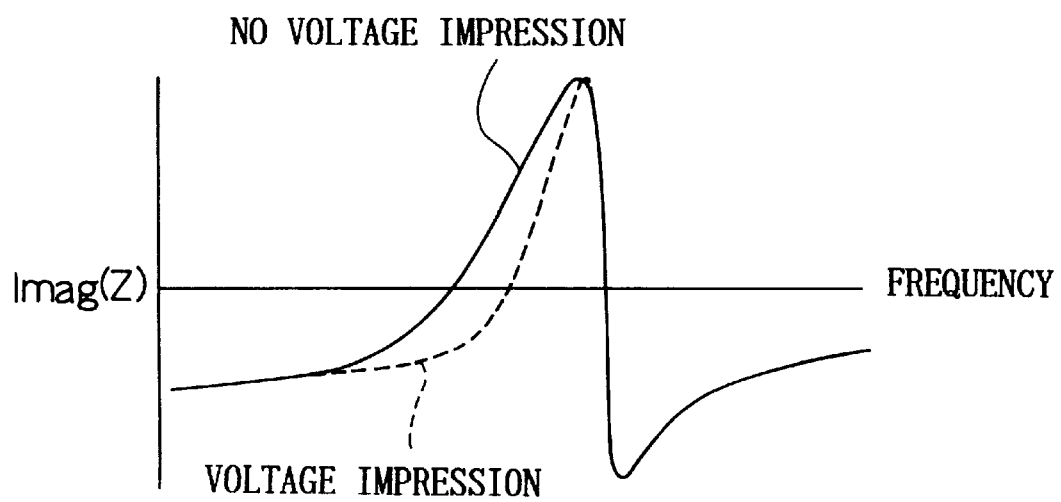
FIG. 6 is graph showing the resonance characteristics for embodiment 3 of the invention.
Figure 7:
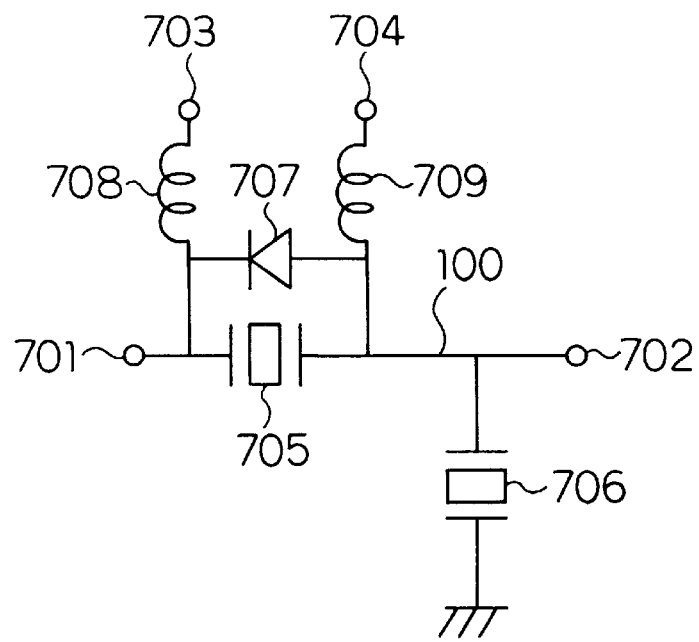
FIG. 7 is a circuit diagram in the embodiment 4 of the invention.

The ladder type embodiment 3 of the invention will be described. A filter was made with the use of the LiTaO₃ substrate of 36° Y cut X propagation as a substrate of forming the surface acoustic wave resonator. An element which changes in capacity by voltage to be impressed, namely a varactor diode is connected in series with a resonator connected in series with the signal wire at this time. The connection at this time is shown in FIG. 5. Reference numeral 501 is an input terminal. Reference terminal 502 is an output terminal. Reference numerals 503, 504 are terminals for impressing the voltage. Reference numeral 505 is a surface acoustic wave resonator which is in series with the signal line 100. Reference numeral 506 is a surface acoustic wave resonator which is located between the signal line 100 and the earth. Reference numeral 507 is a varactor diode. Reference numerals 508, 509 are coils for isolating the voltage impressing terminal in high frequency. The surface acoustic wave filter was constructed as described above and the voltage to be impressed upon the varactor diode was changed. The series connecting circuit of the varactor diode and the surface acoustic wave resonator connected in series with the signal line 100, showed such a resonance curve as shown in FIG. 6. The resonance point moved in this manner, thus resulting in the movement of the attenuation pole of the filter.

Embodiment 4

Figure 8:
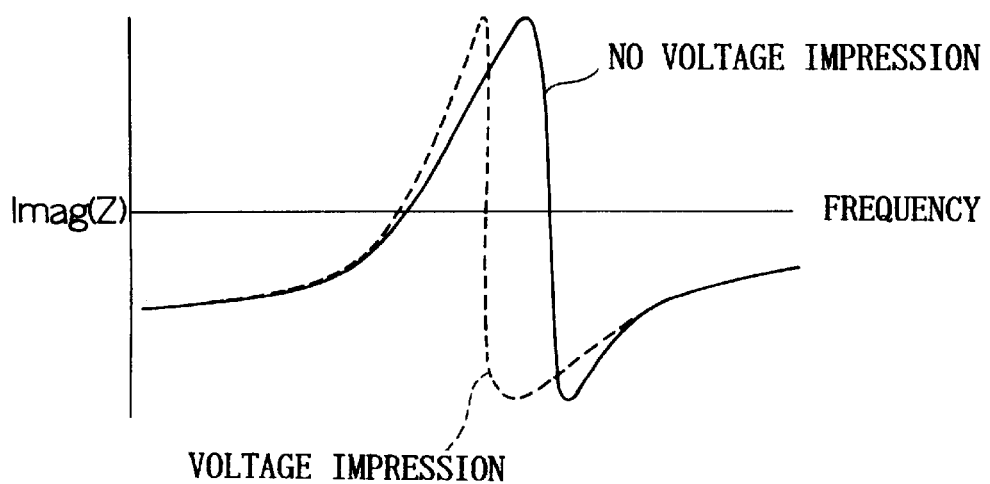
FIG. 8 is a graph showing the resonance characteristics in the embodiment 4 of the invention.

The ladder type embodiment 4 of the invention will be described. A filter was made with the use of the LiTaO₃ substrate of 36° Y cut X propagation as a substrate of forming the surface acoustic wave resonator. An element which changes in the capacity by voltage to be impressed, namely a varactor diode is connected in parallel to the the resonator which is connected in series with the signal wire Reference numeral 701 is an input terminal. Reference terminal 702 is an output terminal. Reference numerals 703, 704 are terminals for impressing the voltage. Reference numeral 705 is a surface acoustic wave resonator which is in series with the signal line 100. Reference numeral 706 is a surface acoustic wave resonator which is located between the signal line 100 and the earth. Reference numeral 707 is a varactor diode. Reference numerals 708, 709 are coils for isolating the voltage impressing terminal in high frequency. The surface acoustic wave filter was constructed as described above and the voltage to be impressed upon the varactor diode was changed. The parallel connecting circuit of the varactor diode and the elastic surface resonator connected in series with the signal line 100, showed such a resonance curve as shown in FIG. 8. The anti-resonance point moved in this manner, thus resulting in the movement of the passband of the filter.

Embodiment 5

Figure 9:
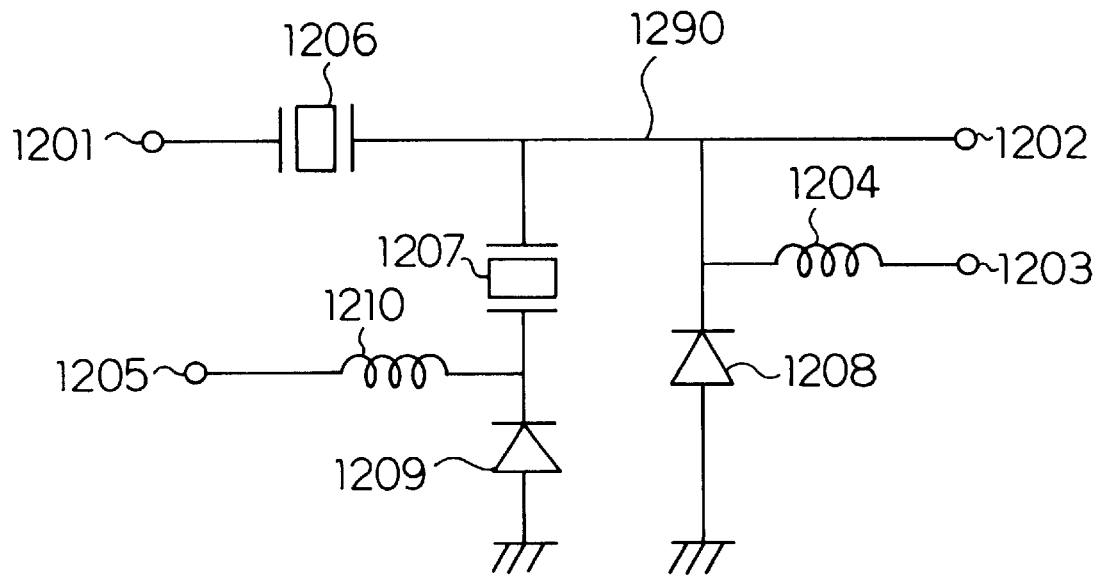
FIG. 9 is a circuit diagram for embodiment 5 of the invention.

The ladder type embodiment 5 of the invention will be described. A filter was made with the use of the LiTaO₃ substrate of 36° Y cut X propagation as a substrate of forming the surface acoustic wave resonator. An element which changes in capacity by voltage to be impressed namely a varactor diode is connected in series with a resonator connected between the signal wire and the earth at this time, and further an element which changes in capacity by voltage to be impressed, namely a varactor diode is connected in parallel to the resonator connected between the signal wire and the earth. The connection at this time is shown in FIG. 9. Reference numeral 1201 is an input terminal. Reference numeral 1202 is an output terminal. Reference numerals 1202, 1203, 1205 are terminals for impressing the voltage upon the varactor diodes. Reference numeral 1206 is a surface acoustic wave resonator connected in series with the signal line 100. Reference numeral 1207 is a surface acoustic wave resonator which is connected in parallel to the signal line 100. Reference numeral 1208 is a varactor diode connected in parallel to the resonator 1207. Reference numeral 1209 is a varactor diode connected in series with the surface acoustic wave resonator 1207. Reference numerals 1204, 1210 are coils for isolating the voltage impressing terminal in high frequency. The surface acoustic wave filter was constructed as described above and the voltage to be impressed upon the varactor diode changed, thus resulting in movement of the passband and the attenuation pole of the filter.

Embodiment 6

Figure 10:
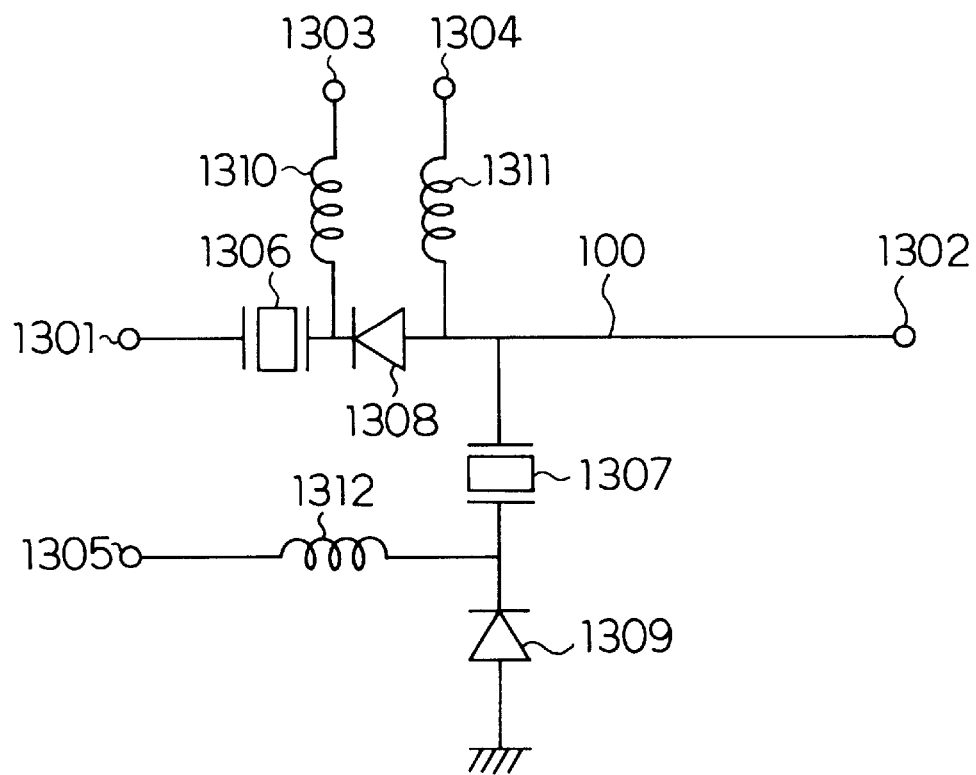
FIG. 10 is a circuit diagram for embodiment 6 of the invention.

The ladder type embodiment 6 of the invention will be described. A filter was made with the use of the LiTaO₃ substrate of 36° Y cut X propagation as a substrate of forming the surface acoustic wave resonator. An element which changes in capacity by voltage to be impressed, namely a varactor diode is connected in series to a resonator connected in series with the signal line 100 at this time, and further an element which changes in capacity by voltage to be impressed , namely a varactor diode is connected in series with the resonator connected between the signal line 100 and the earth. The connection at this time is shown in FIG. 10. Reference numeral 1301 is an input terminal. Reference numeral 1302 is an output terminal. Reference numerals 1303, 1304, 1305 are terminals for impressing the voltage upon the varactor diodes. Reference numeral 1306 is a surface acoustic wave resonator connected in series with the signal line 100. Reference numeral 1307 is a surface acoustic wave resonator which is connected in parallel to the signal line 100. Reference numeral 1308 is a varactor diode connected in series to the resonator 1306. Reference numerals 1309 is a varactor diode connected in series with the surface acoustic wave resonator 1307. Reference numerals 1310, 1311, 1312 are coils for isolating the voltage impressing terminal in high frequency. The surface acoustic wave filter was constructed as described above and the voltage to be impressed upon the varactor diode changed, thus resulting in movement of the passband and the attenuation pole of the filter.

Embodiment 7

Figure 11:
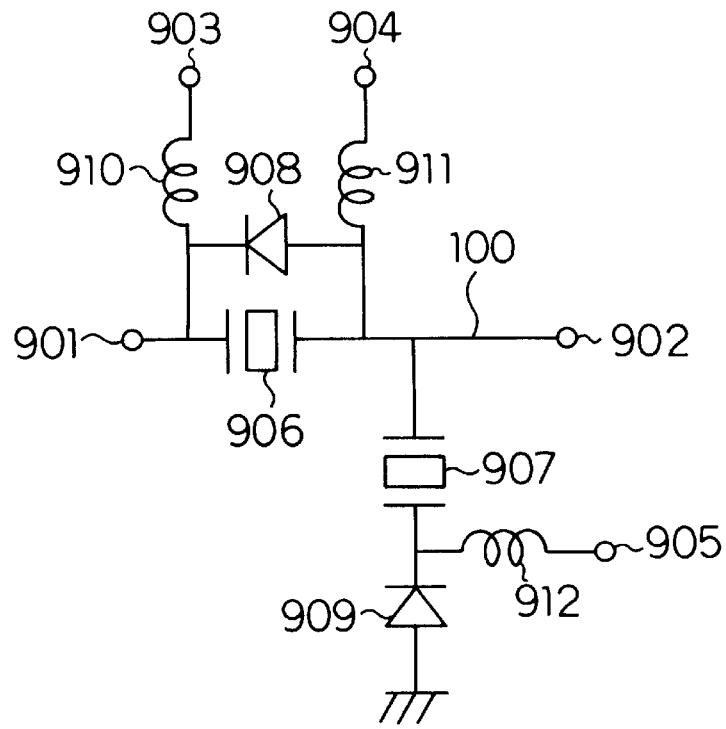
FIG. 11 is a circuit diagram for embodiment 7 of the invention.

The ladder type embodiment 7 of the invention will be described. A filter was made with the use of the LiTaO₃ substrate of 36° Y cut X propagation as a substrate of forming the surface acoustic wave resonator. An element which changes in capacity by voltage to be impressed, namely a varactor diode is connected in parallel to a resonator connected in series with the signal wire at this time, and further an element which changes in capacity by voltage to be impressed, namely a varactor diode is connected in series with the resonator connected between the signal wire and the earth. The connection at this time is shown in FIG. 11. Reference numeral 901 is an input terminal. Reference numeral 902 is an output terminal. Reference numerals 903,

904, 905 are terminals for impressing the voltage upon the varactor diodes. Reference numeral 906 is a surface acoustic wave resonator connected in series with the signal line 100. Reference numeral 907 is a surface acoustic wave resonator which is connected in parallel to the signal line 100. Reference numeral 908 is a varactor diode connected in parallel diode 906. Reference numerals 909 is a varactor diode connected in series with the surface acoustic wave resonator 907. Reference numerals 910, 911, 912 are coils for isolating the voltage impressing terminal in high frequency. The surface acoustic wave filter was constructed as described above and the voltage to be impressed upon the varactor diode changed, thus resulting in movement of the passband and the attenuation pole of the filter.

Embodiment 8

Figure 12:
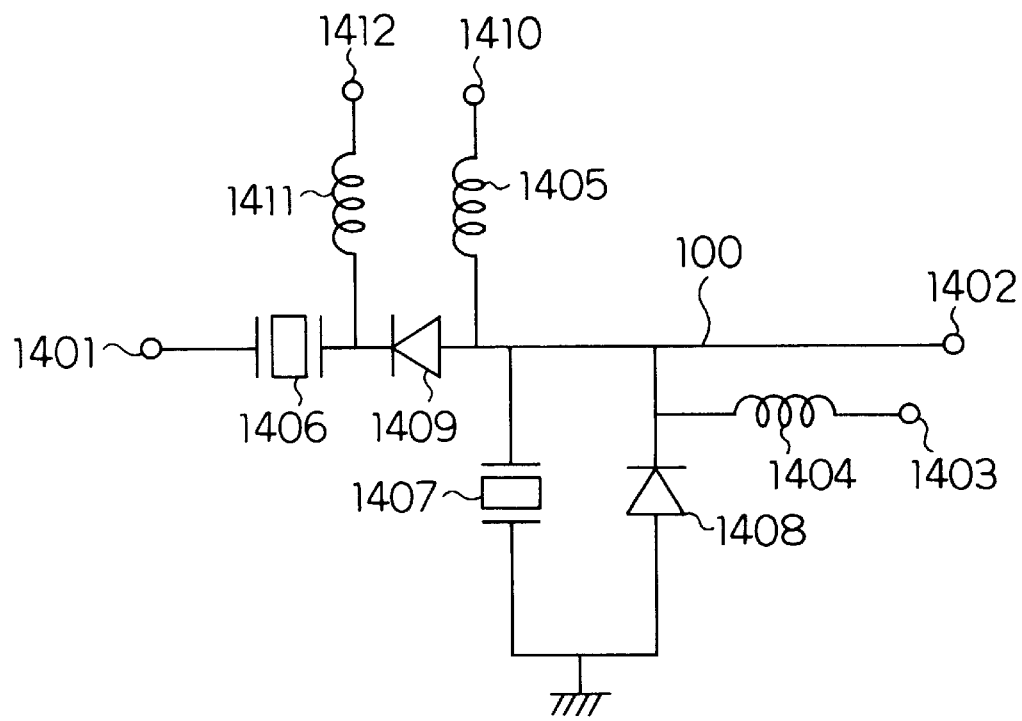
FIG. 12 is a circuit diagram for embodiment 8 of the invention.

The ladder type embodiment 8 of the invention will be described. A filter was made with the use of the LiTaO$_3$ substrate of 36° Y cut X propagation as a substrate of forming the surface acoustic wave resonator. An element which changes in capacity by voltage to be impressed, namely a varactor diode is connected in series to a resonator connected in series with the signal wire at this time, and further an element which changes in capacity by voltage to be impressed, namely a varactor diode is connected in parallel with the resonator connected between the signal wire and the earth. The connection at this time is shown in FIG. 12. Reference numeral 1401 is an input terminal. Reference numeral 1402 is an output terminal. Reference numerals 1403, 1405, 1410 are terminals for impressing the voltage upon the varactor diodes. Reference numeral 1406 is a surface acoustic wave resonator connected in series with the signal line 100. Reference numeral 1407 is a surface acoustic wave resonator which is connected in parallel to the signal line 100. Reference numeral 1409 is a varactor diode connected in series with the resonator 1406 parallel with the surface acoustic wave resonator 1407. Reference numerals 1404,1405,1411 are coils for isolating the voltage impressing terminal in high frequency. The surface acoustic wave filter was constructed as described above and the voltage to be impressed upon the varactor diode changed, thus resulting in movement of the passband and the attenuation pole of the filter.

Embodiment 9

Figure 13:
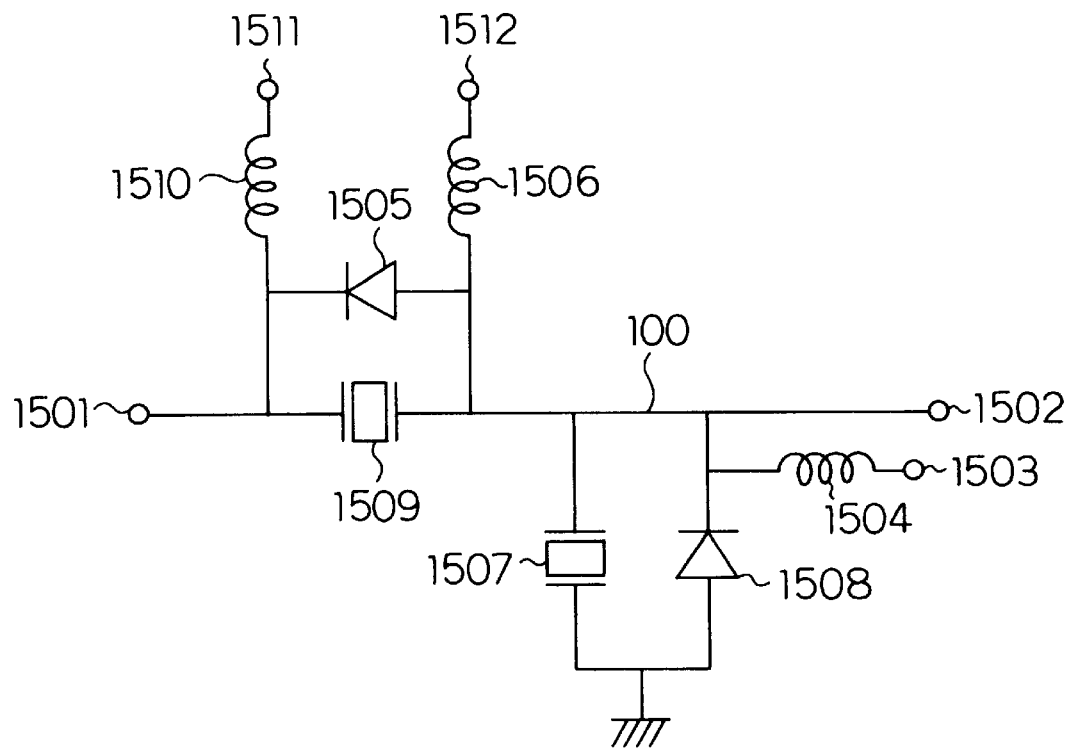
FIG. 13 is a circuit diagram for embodiment 9 of the invention.

The ladder type embodiment 9 of the invention will be described. A filter was made with the use of the LiTaO$_3$ substrate of 36° Y cut X propagation as a substrate of forming the surface acoustic wave resonator. An element which changes in capacity by voltage to be impressed, namely a varactor diode is connected in parallel to a resonator connected in series with the signal wire at this time, and further an element which changes in capacity by voltage to be impressed, namely a varactor diode is connected in parallel with the resonator connected between the signal wire and the earth. The connection at this time is shown in FIG. 13. Reference numeral 1501 is an input terminal. Reference numeral 1502 is an output terminal. Reference numerals 1503, 1511, 1512 are terminals for impressing the voltage upon the varactor diodes. Reference numeral 1509 is a surface acoustic wave resonator connected in series with the signal line 100. Reference numeral 1507 is a surface acoustic wave resonator which is connected in parallel to the signal line 100. Reference numeral 1505 is a varactor diode connected in parallel to the resonator 1509. Reference numeral 1508 is a varactor diode connected in parallel with the surface acoustic wave resonator 1507. Reference numerals 1503, 1506, 1510 are coils for isolating the voltage impressing terminal in high frequency. The surface acoustic wave filter was constructed as described above and the voltage to be impressed upon the varactor diode changed, thus resulting in movement of the passband and the attenuation pole of the filter.

Embodiment 10

Figure 14:
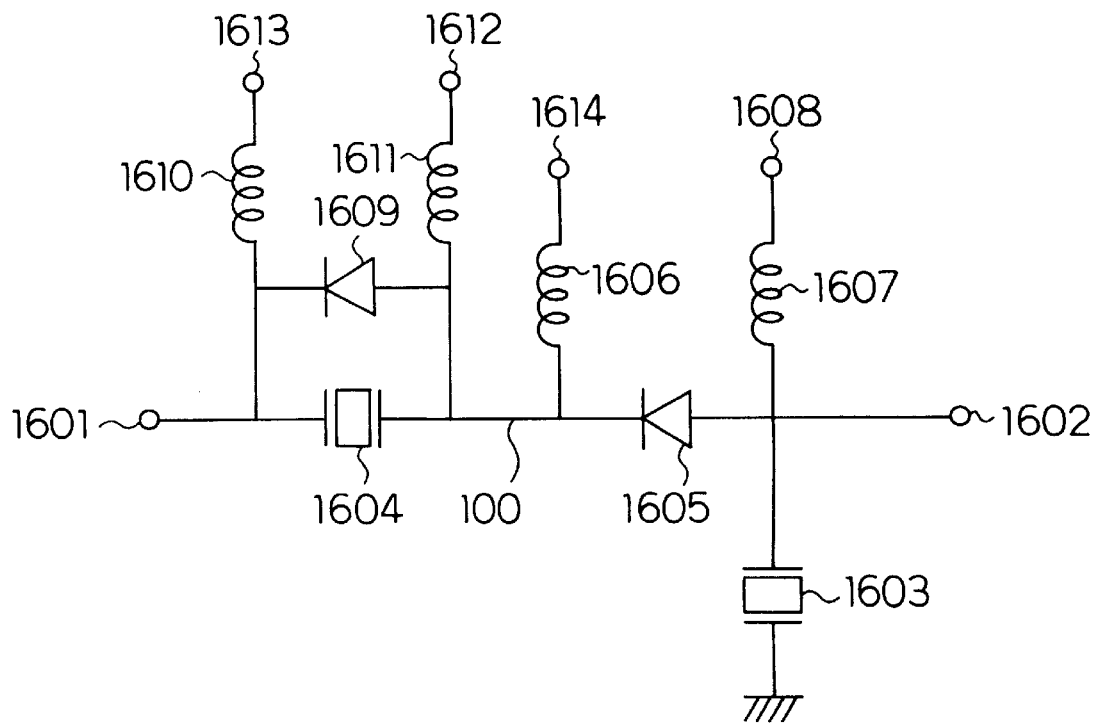
FIG. 14 is a circuit diagram for embodiment 10 of the invention.

The ladder type embodiment 101 of the invention will be described. A filter was made with the use of the LiTaO$_3$ substrate of 36° Y cut X propagation as a substrate of forming the surface acoustic wave resonator. An element which changes in capacity by voltage to be impressed, namely a varactor diode is connected in parallel to a resonator connected in series with the signal wire at this time, and further an element which changes in capacity by voltage to be impressed, namely a varactor diode is connected in series with the resonator connected in series with the signal wire. The connection at this time is shown in FIG. 14. Reference numeral 901 is an input terminal. Reference numeral 1602 is an output terminal. Reference numerals 1607, 1608, 1612.1613 are terminals for impressing the voltage upon the varactor diodes. Reference numeral 1604 is a surface acoustic wave resonator connected in series with the signal line 100. Reference numeral 1603 is a surface acoustic wave resonator which is connected in parallel to the signal line 100. Reference numeral 1609 is a varactor diode connected in parallel to the resonator 1604. Reference numeral 1608 is a varactor diode connected in series with the surface acoustic wave resonator 1604. Reference numerals 1606, 1607, 1610, 1611 are coils for isolating the voltage impressing terminal in high frequency. The surface acoustic wave filter was constructed as described above and the voltage to be impressed upon the varactor diode changed, thus resulting in movement of the passband and the attenuation pole of the filter.

Embodiment 11

Figure 15:
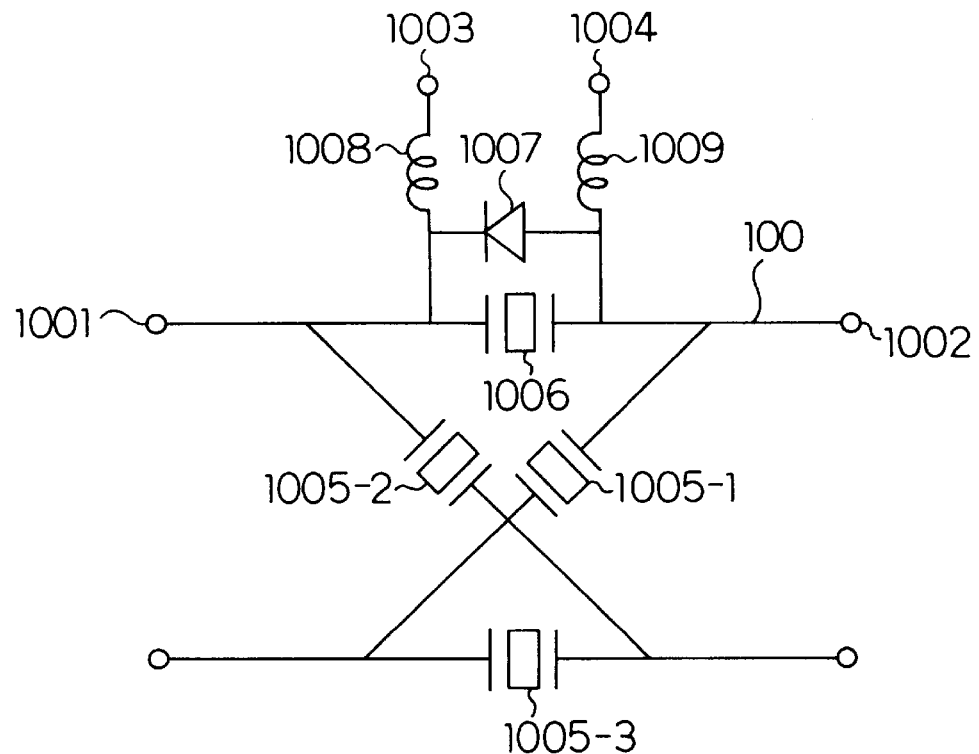
FIG. 15 is a circuit diagram for embodiment 11 of the invention.

The lattice type embodiment 6 of the invention will be described. A filter was made with the use of the LiTaO$_3$ substrate of 36° Y cut X propagation as a substrate of forming the surface acoustic wave resonator. An element which changes in capacity by voltage to be impressed, namely varactor diode is connected in parallel to the elastic surface resonator at this time. The connection at this time is shown in FIG. 15. Reference numeral 1001 is an input terminal. Reference numeral 1002 is an output terminal. Reference numerals 1003, 1004 are terminals for impressing the voltage. Reference numerals 1005-1, 1005-2, and 1005-3 are surface acoustic wave resonators. Reference numeral 1006 is a surface acoustic wave resonator which is connected in parallel to the varactor diode. Reference numeral 1007 is a varactor diode. Reference numerals 1008, 1009 are coils for isolating the voltage impressing terminal in high frequency. The surface acoustic wave filter was made, for trial, of such construction and the voltage to be impressed upon the varactor diode was changed, thus resulting in movement of the passband of the filter.

Embodiment 12

Figure 16:
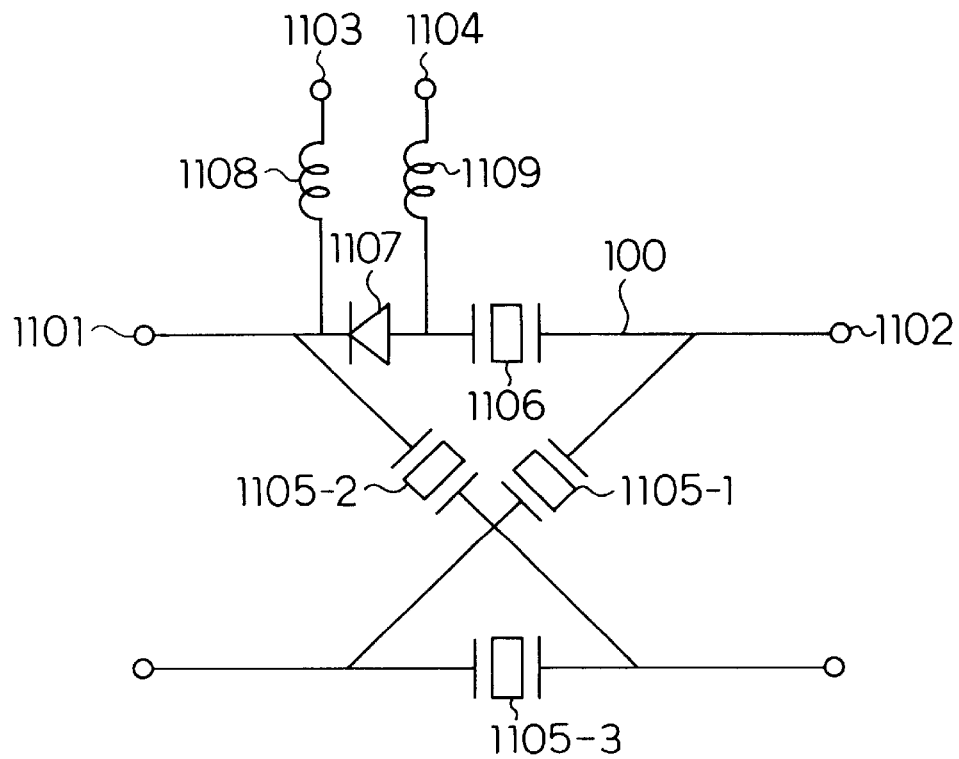
FIG. 16 is a circuit diagram for embodiment 12 of the invention.
Figure 17:
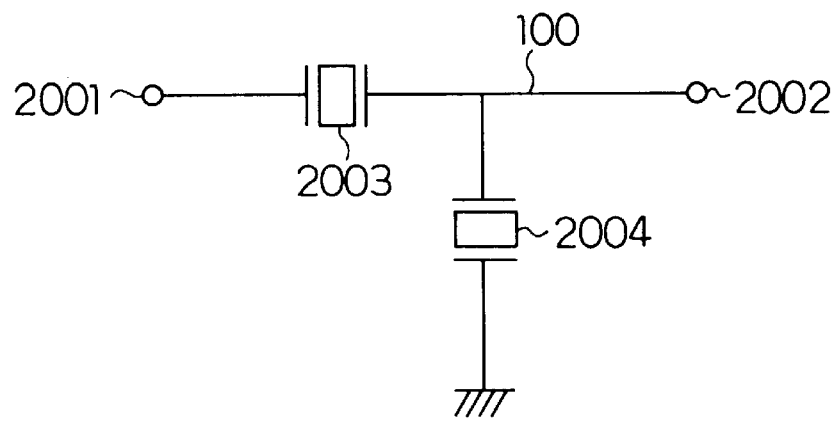
FIG. 17 is a circuit diagram of a conventional surface acoustic wave filter.
Figure 18:
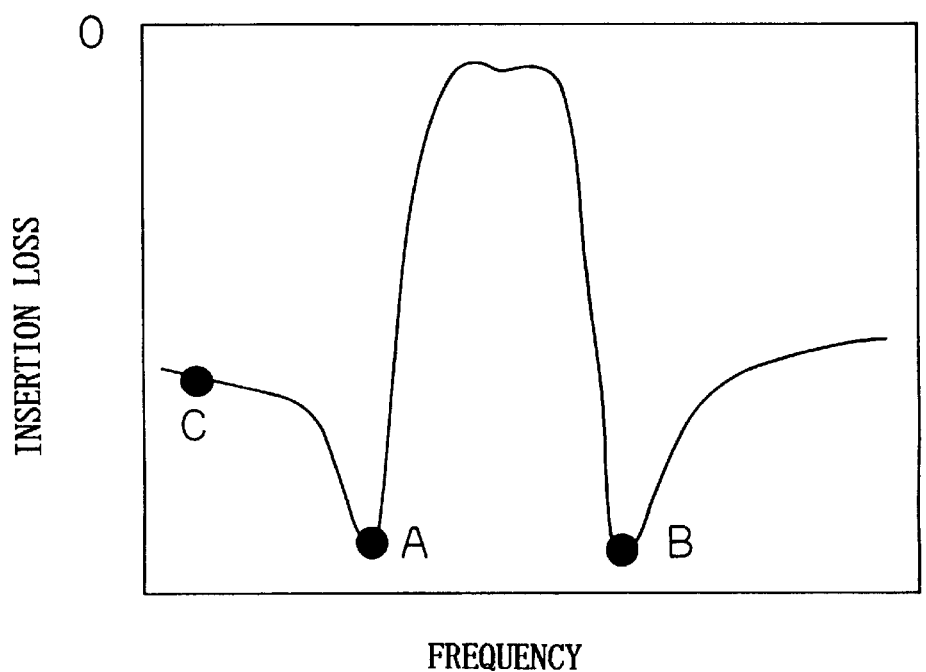
FIG. 18 is a graph showing the characteristics of the conventional surface acoustic wave filter.

The lattice type embodiment 7 of the invention will be described. A filter was made with the use of the LiTaO$_3$ substrate of 36° Y cut X propagation as a substrate of forming the surface acoustic wave resonator. An element which changes in capacity by voltage to be impressed, namely a varactor diode is connected in series with the elastic surface resonator at this time. The connection at this time is shown in FIG. 16. Reference numeral 1101 is an input terminal. Reference numeral 1102 is an output terminal. Reference numerals 1103, 1104 are terminals for impressing the voltage. Reference numerals 1105-1, 1105-2, and 1105-3 are surface acoustic wave resonators. Reference numeral 1106 is a surface acoustic wave resonator which is connected in series with the varactor diode. Reference numeral 1107 is a varactor diode. Reference numerals 1108, 1109 are coils for isolating the voltage impressing terminal in high frequency. The surface acoustic wave filter was made, for trial, of such construction and the voltage to be impressed upon the varactor diode was changed, thus resulting in movement of the passband of the filter.

The circuit in the above-mentioned drawings and descriptions is usually used with being connected to each other to make a multi-stages.

Also, an element is not restricted to a varactor diode if the element has similar characteristics as an element to change in capacity by the voltage, and for example it is a PIN diode.

Also, the connection between the surface acoustic wave resonator and the varactor diode in the above-mentioned drawings and the descriptions is one example, and of course the other arrangement may be used.

Also, although the $LiTaO_3$ substrate of 36° Y cut X propagation was used as a piezo-electric member for forming an elastic surface resonator, it is needless to say that similar effects can be obtained if a similar piezo-electric member such as $LiNbO_3$ or quartz crystal substrate is used.

Also, it is clear that the surface acoustic wave resonator, though not shown in construction especially, is good if the resonance characteristics are electrically obtained.

According to the present invention a surface acoustic wave filter for controlling a passband, an attenuation pole by changing the voltage to be impressed can be made.

What is claimed is:

1. A resonator type surface acoustic wave filters comprising:
   a plurality of one-port surface acoustic wave resonators connected in a ladder configuration, and
   a circuit element having a capacitance that varies in response to a voltage impressed upon the circuit element, the circuit element being connected in series with one of the resonators.

2. The resonator type surface acoustic wave filter according to claim 1, wherein said plurality of resonators are two surface acoustic wave resonators.

3. The resonator type surface acoustic wave filter according to claim 1, wherein the circuit element is a varactor diode.

4. The resonator type surface acoustic wave filter according to claim 1, further including a second circuit element having a capacitance that varies in response to a voltage impressed upon the second circuit element, the second circuit element being connected in parallel with the first circuit element and the one of the resonators.

5. The resonator type surface acoustic wave filter according to claim 4, further including a coil having one end connected to the second circuit element such that a voltage impressed upon the second circuit element can be applied through the coil.

6. The resonator type surface acoustic wave filter according to claim 1, further including a second circuit element having a capacitance that varies in response to a voltage impressed upon the second circuit element, the second circuit element being connected in series with another of the resonators.

7. The resonator type surface acoustic wave filter according to claim 6, further including a coil having one end connected to the second circuit element such that a voltage impressed upon the second circuit element can be applied through the coil.

8. The resonator type surface acoustic wave filter according to claim 1, further including a second circuit element having a capacitance that varies in response to a voltage impressed upon the second circuit element, the second circuit element being connected in parallel with another of the resonators.

9. The resonator type surface acoustic wave filter according to claim 8, further including a coil having one end connected to a first terminal of the second circuit element such that a voltage impressed upon the second circuit element can be applied through the coil.

10. The resonator type surface acoustic wave filter according to claim 9, further including a second coil having one end connected to a second terminal of the second circuit element such that a voltage impressed upon the second circuit element can be applied through the second coil.

11. The resonator type surface acoustic wave filter according to claim 1, further including a second circuit element having a capacitance that varies in response to a voltage impressed upon the second circuit element, the second circuit element being connected in parallel with the one of the resonators.

12. The resonator type surface acoustic wave filter according to claim 11, further including a coil having one end connected to a first terminal of the second circuit element such that a voltage impressed upon the second circuit element can be applied through the coil.

13. The resonator type surface acoustic wave filter according to claim 12, further including a second coil having one end connected to a second terminal of the second circuit element such that a voltage impressed upon the second circuit element can be applied through the second coil.

14. The resonator type surface acoustic wave filter according to claim 1, further including a first coil having one end connected to a first terminal of the circuit element such that a voltage impressed upon the circuit element can be applied through the first coil.

15. The resonator type surface acoustic wave filter according to claim 14, further including a second coil having one end connected to a second terminal of the circuit element such that a voltage impressed upon the circuit element can be applied through the second coil.

16. The resonator type surface acoustic wave filter according to claim 15, further including a second circuit element having a capacitance that varies in response to a voltage impressed upon the second circuit element, the second circuit element being connected in series with another of the resonators.

17. The resonator type surface acoustic wave filter according to claim 16, further including a third coil having one end connected to the second circuit element such that a voltage impressed upon the second circuit element can be applied through the third coil.

18. The resonator type surface acoustic wave filter according to claim 15, further including a second circuit element having a capacitance that varies in response to a voltage impressed upon the second circuit element, the second circuit element being connected in parallel with the one of the resonators.

19. The resonator type surface acoustic wave filter according to claim 18, further including a coil having one end connected to a first terminal of the second circuit element such that a voltage impressed upon the second circuit element can be applied through the coil.

20. The resonator type surface acoustic wave filter according to claim 19, further including a second coil having one end connected to a second terminal of the second circuit element such that a voltage impressed upon the second circuit element can be applied through the second coil.

21. The resonator type surface acoustic wave filter according to claim 14, further including a second circuit element having a capacitance that varies in response to a voltage impressed upon the second circuit element, the second circuit element being connected in parallel with the first circuit element and the one of the resonators.

22. The resonator type surface acoustic wave filter according to claim 21, further including a second coil having one end connected to the second circuit element such that a voltage impressed upon the second circuit element can be applied through the second coil.

23. The resonator type surface acoustic wave filter according to claim 14, further including a second circuit element having a capacitance that varies in response to a voltage impressed upon the second circuit element, the second circuit element being connected in series with another of the resonators.

24. The resonator type surface acoustic wave filter according to claim 23, further including a coil having one end connected to the second circuit element such that a voltage impressed upon the second circuit element can be applied through the coil.

25. The resonator type surface acoustic wave filter according to claim 14, further including a second circuit element having a capacitance that varies in response to a voltage impressed upon the second circuit element, the second circuit element being connected in parallel with another of the resonators.

26. The resonator type surface acoustic wave filter according to claim 25, further including a second coil having one end connected to a first terminal of the second circuit element such that a voltage impressed upon the second circuit element can be applied through the second coil.

27. The resonator type surface acoustic wave filter according to claim 26, further including a third coil having one end connected to a second terminal of the second circuit element such that a voltage impressed upon the second circuit element can be applied through the third coil.

28. The resonator type surface acoustic wave filter according to claim 26, further including a third coil having one end connected to a second terminal of the first circuit element such that a voltage impressed upon the first circuit element can be applied through the third coil.

29. The resonator type surface acoustic wave filter according to claim 14, further including a second circuit element having a capacitance that varies in response to a voltage impressed upon the second circuit element, the second circuit element being connected in parallel with the one of the resonators.

30. The resonator type surface acoustic wave filter according to claim 29, further including a coil having one end connected to a first terminal of the second circuit element such that a voltage impressed upon the second circuit element can be applied through the coil.

31. The resonator type surface acoustic wave filter according to claim 30, further including a second coil having one end connected to a second terminal of the second circuit element such that a voltage impressed upon the second circuit element can be applied through the second coil.

32. A resonator type surface acoustic wave filter, comprising:

a plurality of one-port surface acoustic wave resonators connected in a ladder configuration, and a circuit element having a capacitance that varies in response to a voltage impressed upon the circuit element, the circuit element being connected in parallel with one of the resonators.

33. The resonator type surface acoustic wave filter according to claim 32, wherein the circuit element is a varactor diode.

34. The resonator type surface acoustic wave filter according to claim 32, wherein said plurality of resonators are two surface acoustic wave resonators.

35. The resonator type surface acoustic wave filter according to claim 32, further including a coil having one end connected to the circuit element such that a voltage impressed upon the circuit element can be applied through the coil.

36. The resonator type surface acoustic wave filter according to claim 35, further including a second coil having one end connected to a second terminal of the circuit element such that a voltage impressed upon the circuit element can be applied through the second coil.

37. The resonator type surface acoustic wave filter according to claim 35, further including a second circuit element having a capacitance that varies in response to a voltage impressed upon the second circuit element, the second circuit element being connected in parallel with another of the resonators.

38. The resonator type surface acoustic wave filter according to claim 37, further including a coil having one end connected to a first terminal of the second circuit element such that a voltage impressed upon the second circuit element can be applied through the coil.

39. The resonator type surface acoustic wave filter according to claim 38, further including a second coil having one end connected to a second terminal of the second circuit element such that a voltage impressed upon the second circuit element can be applied through the second coil.

40. The resonator type surface acoustic wave filter according to claim 32, further including a second circuit element having a capacitance that varies in response to a voltage impressed upon the second circuit element, the second circuit element being connected in parallel with another of the resonators.

41. The resonator type surface acoustic wave filter according to claim 40, further including a coil having one end connected to a first terminal of the second circuit element such that a voltage impressed upon the second circuit element can be applied through the coil.

42. The resonator type surface acoustic wave filter according to claim 41, further including a second coil having one end connected to a second terminal of the second circuit element such that a voltage impressed upon the second circuit element can be applied through the second coil.

* * * * *